(12) United States Patent
Kwon

(10) Patent No.: US 6,204,703 B1
(45) Date of Patent: Mar. 20, 2001

(54) POWER ON RESET CIRCUIT WITH POWER NOISE IMMUNITY

(75) Inventor: Suk-Chun Kwon, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/216,884

(22) Filed: Dec. 21, 1998

(51) Int. Cl.[7] .................................................. H03L 7/00
(52) U.S. Cl. ............................................ 327/143; 327/198
(58) Field of Search .................................... 327/142, 143, 327/198, 437, 427

(56) References Cited

U.S. PATENT DOCUMENTS 5,831,460 * 11/1998 Zhou ..................................... 327/143
5,933,036 * 11/1998 Kim ...................................... 327/143

* cited by examiner

Primary Examiner—Toan Tran
Assistant Examiner—Hiep Nguyen

(74) Attorney, Agent, or Firm—Jones Volentine, L.L.C.

(57) ABSTRACT

A power on reset includes a latch controller and a latch circuit. The latch controller sets the latch circuit to an initialization state when a power supply voltage is less than a first threshold voltage during power-up, so that a power on reset signal from the latch circuit has the power supply voltage, a logical high level (i.e., goes to a logically activated state). The latch controller resets the latch circuit when the power supply voltage becomes higher than a second threshold voltage which is higher than the first threshold voltage, so that the power on reset signal goes to the ground voltage Vss, a logical low level (i.e., goes to a logically inactivated state). According to such a circuit configuration, even though the power supply voltage oscillates around a voltage at a point in time when the power on reset signal transitions from the power supply voltage to the ground voltage, the power on reset signal continues to be maintained at a previous set state. This prevents logic elements, to be set at a desired state during power-up, from performing needless operations because of the power oscillation. Therefore, the power on reset circuit according to the present invention has an improved power noise immunity.

17 Claims, 4 Drawing Sheets

POWER ON RESET CIRCUIT WITH POWER NOISE IMMUNITY

FIELD OF THE INVENTION

The present invention relates to a semiconductor integrated circuits and, more particularly to a power on reset circuit to set logic elements at a desired initialization condition during power-up.

BACKGROUND OF THE INVENTION

In certain integrated circuit (IC) design applications, it is desirable or even necessary to provide a reset signal for certain types of logic elements. These logic elements are typically memory circuits of one type or another which will remain in a certain state once having been set to that state. Such elements include flip-flops, counters, timers and other similar circuits. To ensure proper operation of the circuit which contains such elements, a reset signal is typically provided during power-up of the circuit to set these elements to a certain desired condition. Normally, it is desirable to have this reset occur automatically during power-up, that is, during the period of time when the voltage from the power supply voltage is transitioning from zero volts to the nominal voltage used to power the circuit.

Referring to FIG. 1, a power on reset circuit 10 according to the prior art is illustrated. The power on reset circuit 10 is composed of three PMOS transistors 12, 14 and 20, three NMOS transistors 16, 18 and 22, and one inverter 24. The PMOS transistor 12 has a source connected to a power supply voltage Vcc, and a drain and a gate of the PMOS transistor 12 are connected both to each other and to a node N1. The PMOS transistor 14, whose gate is connected to a ground voltage Vss, has a source connected to the power supply voltage Vcc and a drain tied to a node N2. A gate of the NMOS transistor 16 is coupled to the node N1, a drain thereof is connected to the node N2, and its source is grounded. The PMOS transistor 20 and the NMOS transistor 22 act as an inverter circuit. Gates of the transistors 20 and 22 are connected in common to the node N2 and their current paths are sequentially made between the power supply voltage Vcc and the ground voltage Vss. The inverter 24 is connected between the node N3 and an output terminal 26 for outputting a power on reset signal POR. The NMOS transistor 18 has a gate connected to the output terminal 26 via inverter 24 and a current path made between the node N2 and the ground voltage Vss.

FIG. 2 shows each waveform at respective nodes N2 and N3 and the output terminal 26 during power-up. Operation of the power on reset circuit 10 according to the prior art will be described below with reference to FIGS. 1 and 2.

Initially, all transistors of the power on reset circuit 10 are turned off, because no power supply voltage Vcc is present. When the power supply voltage Vcc slowly increases towards a positive value, the PMOS transistor 14 is slightly turned on at a point of time t1. Then, when the power supply voltage Vcc reaches a voltage Va in FIG. 2, the PMOS transistor 14 becomes fully conductive, so that the node N2 is pulled up to the power supply voltage Vcc through the PMOS transistor 14 at a point of time t2, as shown in FIG. 2.

When the power supply voltage Vcc increases further, the node N2, because the PMOS transistor 14 is conducting, will follow the power supply voltage Vcc until the power supply voltage Vcc reaches a voltage Vb in FIG. 2. At the same time, the PMOS transistor 12 becomes turned on at the same period of time as the PMOS transistor 14. Therefore, the node N1 directly follows the power supply voltage Vcc with a voltage difference which corresponds to the magnitude of the threshold voltage of the PMOS transistor 12.

As the power supply voltage Vcc continues to increase, at a point of time t3, node N1 reaches a voltage Vb which corresponds to the threshold voltage of the NMOS transistor 16, enabling the NMOS transistor 16 to become conductive. As shown in FIG. 2, the node N2 does not follow the power supply voltage Vcc any longer, that is, the voltage of the node N2 is pulled down towards the ground voltage, Vss, through the turned-on NMOS transistor 16 after the point of time t3. The node N3 goes to a logical high level, that is, the power supply voltage Vcc, through the PMOS transistor 20, as illustrated in FIG. 2.

According to the above mentioned process, the power on reset signal POR is first 0 volts since the power supply voltage Vcc is also 0 volts. When the node N2 follows the power supply voltage Vcc, the node N3 is at the ground voltage Vss through the NMOS transistor 22, so that the power on reset signal POR follows the power supply voltage Vcc through the inverter 24. At this time, the logic elements are initialized to a desired condition by means of the power on reset signal POR having the power supply voltage Vcc, a logical high level. Then, when the node N2 becomes discharged towards the ground voltage Vss through the NMOS transistor 16, the power on reset signal POR goes to 0 volts through the inverter 24. That is, the initialization operation for the logic elements has been completed.

If, however, owing to certain causes the power supply voltage Vcc oscillates around the voltage Vb at a point of time t3 when the power on reset signal POR transitions from the power supply voltage Vcc to the ground voltage Vss, the power on reset signal POR also oscillates. This makes the logic elements perform needless operations. Accordingly, it is one problem of the prior art that the power on reset circuit 10 according to the prior art is easily affected by power noise, for example, a power oscillation phenomenon, during power-up.

SUMMARY OF THE INVENTION

It is therefore an object of the present invention to provide a power on reset circuit with improved power noise immunity.

In order to attain the above objects, according to one aspect of the present invention, there is provided a power on reset circuit generating a power on reset signal to set logic elements to a desired initialization state during power-up. The circuit comprises a latch circuit having first and second input terminals and an output terminal for outputting the power on reset signal, and a latch controller connected to the first and second input terminals and having a first threshold voltage and a second threshold voltage higher than the first threshold voltage. The latch controller sets the latch circuit to an initialization state when the power supply voltage is less than the first threshold voltage during power-up, so that the power on reset signal goes to a logically activated state, following the power supply voltage. The latch controller resets the latch circuit when the power supply voltage is higher than the second threshold voltage so that the power on reset signal goes to a logically inactivated state, having the ground voltage level.

BRIEF DESCRIPTION OF THE DRAWINGS

A more complete appreciation of the present invention, and many of the attendant advantages thereof, will become readily apparent as the same becomes better understood by reference to the following detailed description when considered in conjunction with the accompanying drawings in which like reference symbols indicate the same or similar components, wherein.

DESCRIPTION OF THE PREFERRED EMBODIMENTS

A preferred embodiment of the present invention will be described below with reference to the accompanying drawings.

Figure 1:
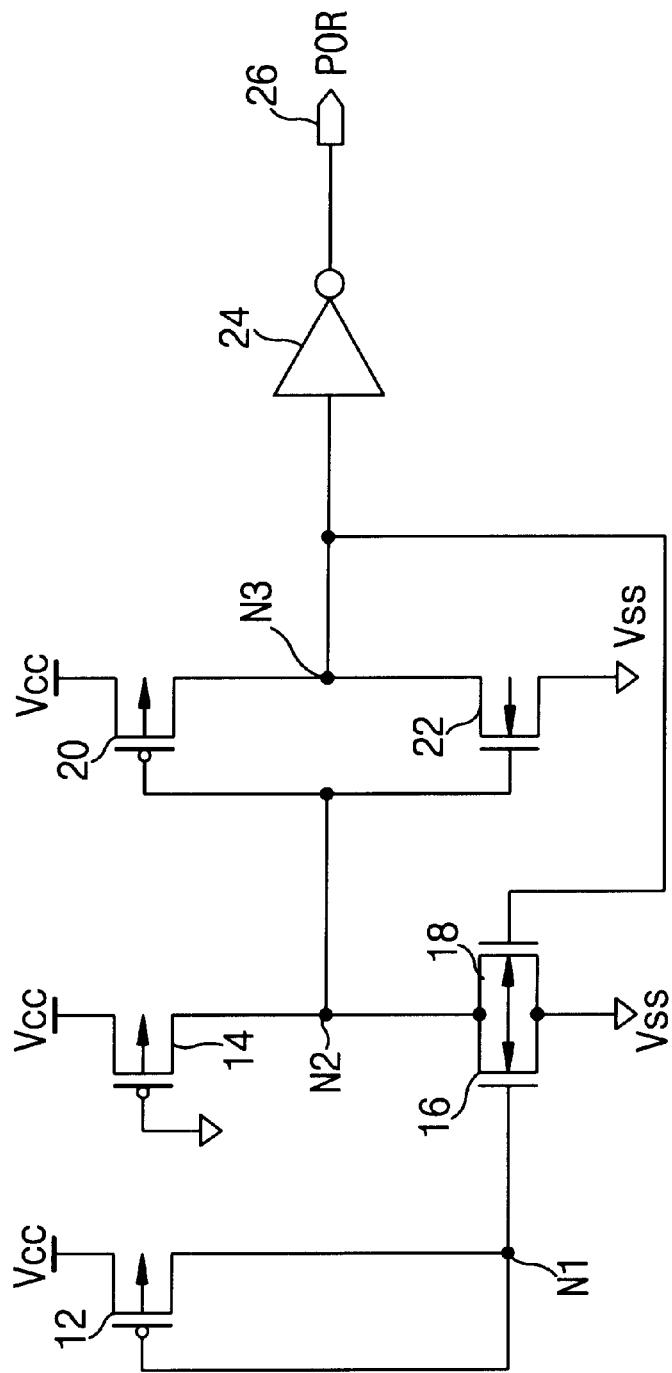
FIG. 1 is a circuit diagram showing a power on reset circuit according to the prior art.
Figure 2:
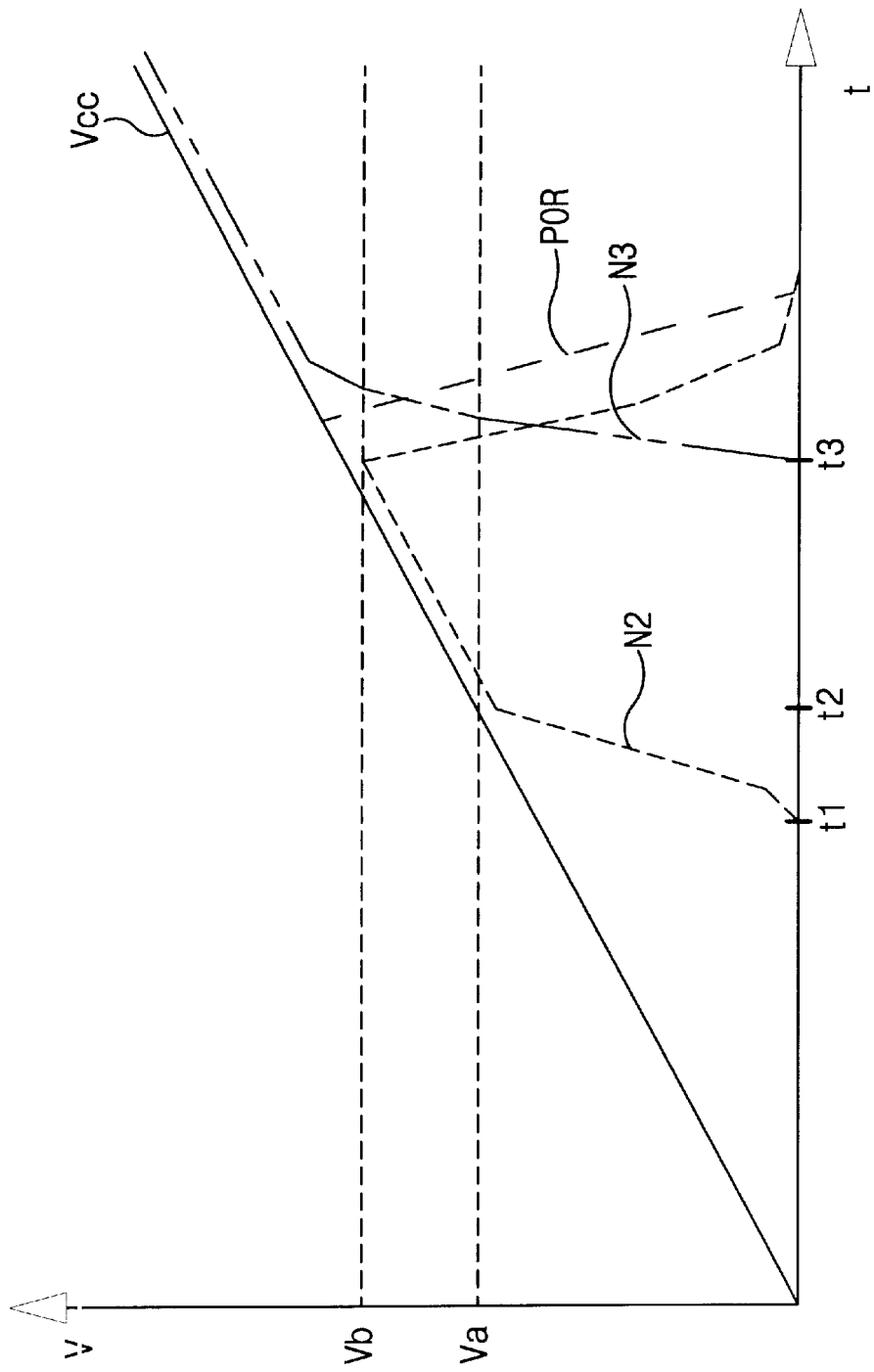
FIG. 2 is a diagram showing waveforms at respective nodes during power-up of the circuit shown in FIG. 1.
Figure 3:
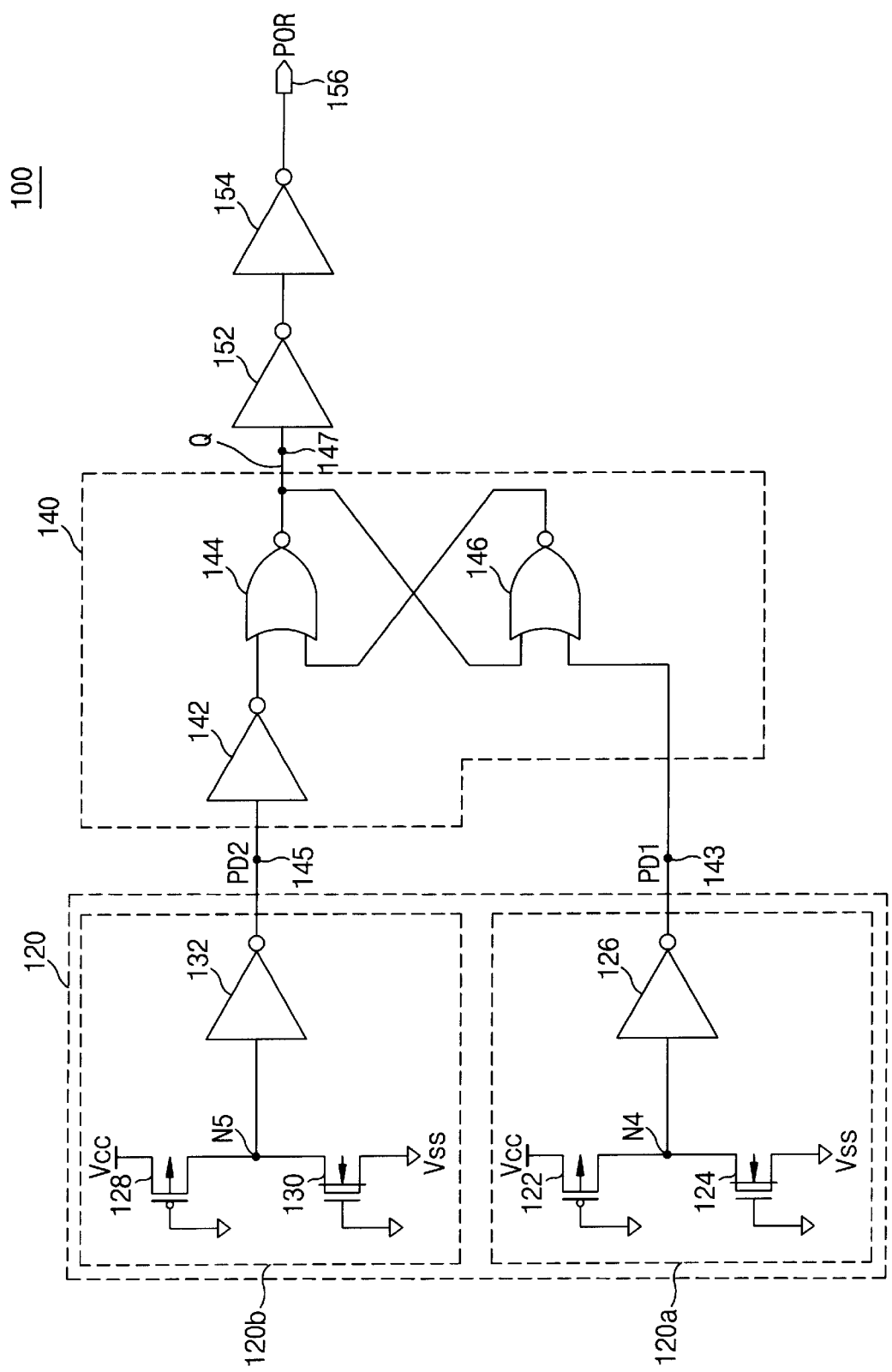
FIG. 3 is a circuit diagram showing a power on reset circuit according to a preferred embodiment of the present invention.

A novel power on reset circuit 100 according to the present invention, referring to FIG. 3, comprises a latch controller 120 and a latch circuit 140. The latch controller 120 sets the latch circuit 140 to an initialization state when the power supply voltage Vcc is less than a first threshold voltage Vt1 during power-up, so that a power on reset signal POR from the latch circuit 140 has the power supply voltage Vcc, a logical high level (i.e., has a logically activated state). The latch controller 120 resets the latch circuit 140 when the power supply voltage Vcc is higher than a second threshold voltage Vt2 higher than the first threshold voltage Vt1, so that the power on reset signal POR therefrom has the ground voltage Vss, a logical low level (i.e., has a logically inactivated state).

According to such a circuit configuration of the present invention, even though the power supply voltage Vcc oscillates around a voltage at a point of time when the power on reset signal POR transitions from the power supply voltage Vcc to the ground voltage Vss, the power on reset signal POR continues to be maintained at a previous set state. This prevents logic elements to be set at a desired state during power-up from performing needless operations because of the power oscillation. Therefore, the power on reset circuit according to the present invention has an improved power noise immunity.

FIG. 3 is a detailed circuit diagram of a power on reset circuit according to a preferred embodiment of the present invention. In FIG. 3, the power on reset circuit 100 is comprised of a latch controller 120, a latch circuit 140 and two series-connected inverters 152 and 154 acting as a buffer.

The latch controller 120 is composed of a first voltage level detector 120a a first threshold voltage Vt1 as its detection voltage, and a second voltage level detector 120b having a second threshold voltage Vt2 as its detection voltage which is higher than the first threshold voltage Vt1. The latch controller 120 sets the latch circuit 140 to an initialization state (i.e., the output thereof, Q, goes to an activated state following the power supply voltage Vcc, a logical high level) when the power supply voltage Vcc is less than the first threshold voltage Vt1 during power-up, so that a power on reset signal POR goes to an activated state following the power supply voltage Vcc. The latch controller 120 resets the latch circuit 140 (i.e., the output thereof, Q, goes to an inactivated state of the ground voltage Vss) when the power supply voltage Vcc becomes higher than the second threshold voltage Vt2, so that the power on reset signal POR goes to the ground voltage Vss.

Referring to FIG. 3, the first voltage level detector 120a has a PMOS transistor 122, a depletion-type NMOS transistor 124 and an inverter 126. The PMOS transistor 122, of which the gate is grounded, has a current path made between the power supply voltage Vcc and a node N4. The depletion-type NMOS transistor 124, whose gate is grounded, has a current path formed between the node N4 and the ground voltage Vss. The inverter 126 has an input terminal connected to the node N4 and an output terminal for outputting a first detection signal PD1. In this embodiment, the inverter 126 has the first threshold voltage Vt1 as its trip voltage.

By such a circuit configuration, the first voltage level detector 120a, which has the first threshold voltage Vt1, detects a level of the power supply voltage Vcc to generate the first detection signal PD1, which has the level of the power supply voltage Vcc (that is, the signal PD1 follows the power supply voltage Vcc) when the first threshold voltage Vt1 is higher than the power supply voltage Vcc. On the other hand, the first detection signal PD1 has the ground voltage Vss when the first threshold voltage Vt1 is less than the power supply voltage Vcc.

With reference to FIG. 3, the second voltage level detector 120b has a PMOS transistor 128, a depletion-type NMOS transistor 130 and an inverter 132. The PMOS transitor 128, of which the gate is grounded, has a current path made between the power supply voltage Vcc and a node N5. The depletion-type NMOS transistor 130, whose gate is grounded, has a current path formed between the node N5 and the ground voltage Vss. The inverter 132 has an input terminal connected to the node N5 and an output terminal for outputting a second detection signal PD2. In this embodiment, the inverter 132 has the second threshold voltage Vt2 as its trip voltage.

According to such a circuit configuration, the second voltage level detector 120b, which has the second threshold voltage Vt2, detects the level of the power supply voltage Vcc to generate the second detection signal PD2. The second detection signal PD2 has the level of the power supply voltage Vcc (that is, the signal PD2 follows the power supply voltage Vcc) when the second threshold voltage Vt2 is higher than the power supply voltage Vcc. On the other hand, the second detection signal PD2 has the ground voltage Vss when the second threshold voltage Vt2 is less than the power supply voltage Vcc.

In this embodiment, the voltage difference between the first and second threshold voltages, Vt1 and Vt2, is set higher than the power supply voltage Vcc oscillation (or dumping) level during power-up.

As shown in FIG. 3, the latch circuit 140 is comprised of one input terminal 143 for receiving the first detection signal PD1, a second input terminal 145 for receiving the second detection signal PD2, one output terminal 147 for outputting its output Q, one inverter 142, and two NOR gates 144 and 146 acting as an SR flip-flop. The inverter 142 receives the second detection signal PD2 through the second input terminal 145 as its input, and one input terminal of the NOR gate 144 is coupled to an output terminal of the inverter 142. The NOR gate 146 has one input terminal connected to the first input terminal 143 of the circuit 140 (that is, it receives the first detection signal PD1), the other input terminal tied to an output terminal of the NOR gate 144 and an output terminal connected to the other input terminal of the NOR gate 144. The buffer constituted of the two inverters 152 and 154 is connected between the output terminal 147 of the latch circuit 140 and an output terminal 156 for outputting the power on reset signal POR, which is used to set logic elements, for example, flip-flops, counters, timers and other similar circuits, to a certain desired condition during power-up.

Figure 4:
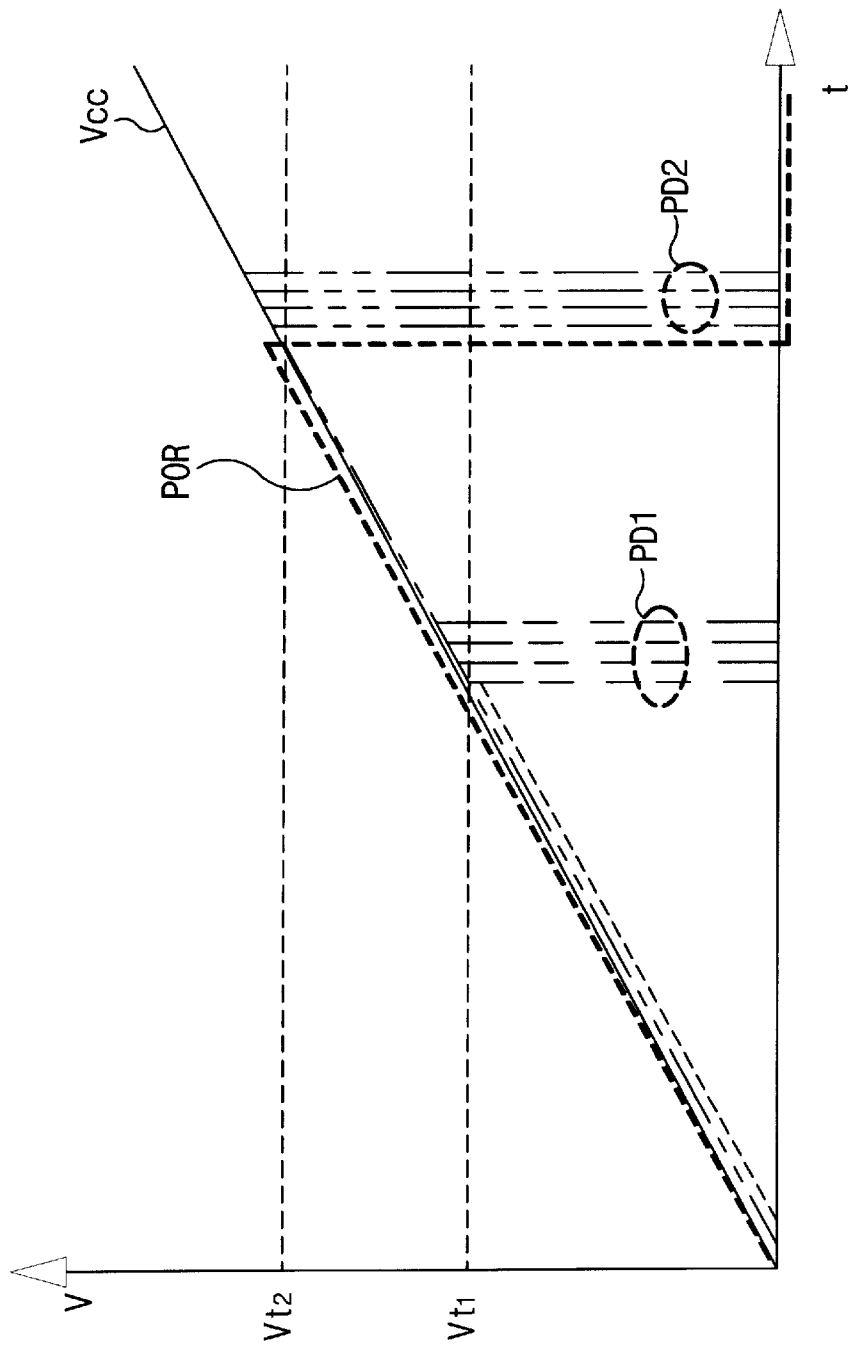
FIG. 4 is a diagram showing the relationship between signal waveforms according to a variation in the power supply voltage during power-up of the circuit shown in FIG. 3.

FIG. 4 is a diagram showing the relationship between signal waveforms according to a variation in the power supply voltage Vcc in the circuit shown in FIG. 3. Operation of the power on reset circuit 100 will be explained with reference to FIGS. 3 and 4.

When the circuit 100 is not powered, the latch controller 120 and the latch circuit are disabled. As the power supply voltage Vcc is supplied to the power on reset circuit 100, the PMOS transistors 122 and 128 of the first and second voltage level detectors 120a and 120b are turned on, so that the nodes N4 and N5 are charged, and then the depletion-type NMOS transistors 124 and 130 become conductive. Therefore, the nodes N4 and N5 don't follow the power supply voltage Vcc any longer. That is, since the voltages on the nodes N4 and N5 are less than the threshold voltages Vt1 and Vt2 of the inverters 126 and 132, the first and second detection signals PD1 and PD2 follow the power supply voltage Vcc through the corresponding inverters 126 and 132, respectively (i.e., the signals PD1 and PD2 each have a logical high level, respectively). This enables the latch circuit 140 to be initialized. In other words, the output of the NOR gate 146 goes to a logical low level because one of its inputs has the power supply voltage Vcc, a logical high level. So the output Q of the latch circuit 140 (or an output of the NOR gate 144) goes to a logical high level. Accordingly, the power on reset signal POR follows the power supply voltage Vcc through the inverters 152 and 154, so that logic elements implemented in a semiconductor integrated circuit having the power on reset circuit 100 are reset to a desired condition.

The first voltage level detector 120a makes the first detection signal PD1 become inactivated when the power supply voltage Vcc exceeds the first threshold voltage Vt1 of the first voltage level detector 120a (i.e., when the voltage of the node N4 goes to the first threshold voltage Vt1 of the inverter 126). That is, the first detection signal PD1 goes to the ground voltage Vss, a logical low level. At this time, the power on reset signal POR continues to follow the power supply voltage Vcc as shown in FIG. 4, so that the power on reset circuit 100 continues to perform the initialization operation for the logic elements.

Subsequently, when the power supply voltage Vcc exceeds the second threshold voltage Vt2 of the second voltage level detector 120b, that is, when the voltage of the node N5 reaches the second threshold voltage Vt2 of the inverter 132, the second voltage level detector 120b makes the second detection signal PD2 go to an inactivated state at the ground voltage Vss, a logical low level. This enables the output Q of the circuit 140, that is, the output of the NOR gate 144, to be reset at a logical low level (0 volts), causing the power on reset signal POR to be inactivated at the ground voltage Vss through the buffer, as illustrated in FIG. 4. Accordingly, an initialization operation for the logic elements has been completed during power-up.

According to the power on reset circuit 100 of the present invention, when the power supply voltage Vcc reaches the first threshold voltage Vt1, the output Q of the latch circuit 140 continues to be maintained at a previous initialized state, even though the power supply voltage Vcc oscillates. Only the first detection signal PD1 oscillates as illustrated in FIG. 4, so that the power on reset signal POR is prevented from oscillating regardless of the power supply voltage oscillation. Similar, when the power supply voltage Vcc reaches the second threshold voltage Vt2, the output Q of the circuit 140, that is, the power on reset signal POR goes to a logical low level (0 volts) even though the power supply voltage Vcc oscillates. As shown in FIG. 4, only the second detection signal PD2 oscillates, so that the power on reset signal POR is prevented from oscillating without regard to the power supply voltage Vcc oscillation. In a word, when the power supply voltage Vcc oscillates around a voltage at a point in time when the power on reset signal POR transitions to the power supply voltage Vss to the ground voltage Vss, the power on reset signal POR never oscillates regardless of the power noise. Accordingly, the power on reset circuit 100 has an improved power noise immunity.

The invention has been described using an exemplary preferred embodiment. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A power on reset circuit for generating a power on reset signal to set logic elements to a desired initialization state during power-up, comprising:

a latch circuit having first and second input terminals and an output terminal that outputs the power on reset signal; and a latch controller connected to the first and second input terminals and having a first threshold voltage, and a second threshold voltage higher than the first threshold voltage, said latch controller setting said latch circuit to an initialization state when a power supply voltage is less than the first threshold voltage during power-up so that the power on reset signal goes to a logically activated state, and said latch controller resetting said latch circuit when the power supply voltage is higher than the second threshold voltage so that the power on reset signal goes to a logically deactivated state, a voltage difference between the first and second threshold voltages being greater than an oscillation of the power supply voltage level during power-up.

2. The power on reset circuit according to claim 1, wherein said latch controller comprises:

a first voltage level detector having the first threshold voltage, said first voltage level detector detecting a power supply voltage level to generate a first detection signal, the first detection signal having the power supply voltage level when the first threshold voltage is higher than the power supply voltage level; and a second voltage level detector having the second threshold voltage, said second voltage level detector detecting the power supply voltage level to generate a second detection signal, the second detection signal having the power supply voltage level when the second threshold voltage is higher than the power supply voltage level.

3. The power on reset circuit according to claim 2, wherein the first detection signal goes to the logically deactivated state when the power supply voltage level is higher than the first threshold voltage, and the second detection signal goes to the logically deactivated state when the power supply voltage level is higher than the second threshold voltage.

4. The power on reset circuit according to claim 2, wherein the logically deactivated state is a logical low state, and the logically activated state is a logical high state.

5. The power on reset circuit according to claim 2, wherein each of said first and second voltage level detectors comprise:
- a PMOS transistor having a gate grounded, a source connected to the power supply voltage and a drain;
- a depletion-type NMOS transistor having a gate grounded, a drain connected to the drain of the PMOS transistor and a source grounded; and
- an inverter circuit having an inverting threshold voltage and an input terminal connected to the drains of the PMOS and depletion-type NMOS transistors,
- the inverting threshold voltages of the inverter circuits of said first and second voltage level detectors being respectively equal to the first and second threshold voltages,
- the inverter circuits of said first and second voltage level detectors respectively outputting the first and second detection signals.

6. The power on reset circuit according to claim 3, wherein a voltage difference between said first and second threshold voltages is greater than a power supply voltage oscillating level during power-up.

7. The power on reset circuit according to claim 1, wherein said latch circuit comprises:
- an inverter having an input terminal that receives the second detection signal and an output terminal;
- a first NOR gate having a first input terminal connected to the output terminal of the inverter, a second input terminal and an output terminal; and
- a second NOR gate having a first input terminal that receives the first detection signal, a second input terminal connected to the output terminal of the first NOR gate, and an output terminal connected to the second input terminal of the first NOR gate.

8. The power on reset circuit according to claim 7, further comprising a buffer circuit connected to the output terminal of the latch circuit and having two series-connected inverters.

9. A power on reset circuit for generating a power on reset signal to set logic elements at a desired initialization state during power-up, comprising:
- a first voltage level detector having a first threshold voltage, said first voltage level detector detecting a power supply voltage level to generate a first detection signal as a detection result, the first detection signal having the power supply voltage level when the first threshold voltage is higher than the power supply voltage level;
- a second voltage level detector having a second threshold voltage higher than the first threshold voltage, said second voltage level detector detecting the power supply voltage level to generate a second detection signal as a detection result, the second detection signal having the power supply voltage level when the second threshold voltage is higher than the power supply voltage level; and
- a latch circuit generating the power on reset signal in response to the first and second detection signals,
- wherein said latch circuit is set to an initialization state when the power supply voltage level is less than the first threshold voltage during power-up, so that the power on reset signal goes to a logically activated state, and
- wherein said latch circuit is reset when the power supply voltage level is higher than the second threshold voltage, so that the power on reset signal goes to a logically deactivated state.

10. The power on reset circuit according to claim 9, wherein a voltage difference between the first and second threshold voltages is greater than an oscillation of the power supply voltage level during power-up.

11. A power on reset circuit comprising:
- a latch circuit having first and second input terminals and an output terminal that outputs a power on reset signal; and
- a latch controller connected to the first and second input terminals and having a first threshold voltage, and a second threshold voltage higher than the first threshold voltage,
- said latch controller setting said latch circuit to an initialization state when a power supply voltage is less than the first threshold voltage during power-up so that the power on reset signal goes to a logically activated state and resetting said latch circuit when the power supply voltage is higher than the second threshold voltage so that the power on reset signal goes to a logically deactivated state,
- said latch circuit comprising
  - an inverter having an input terminal that receives the second detection signal and an output terminal,
  - a first NOR gate having a first input terminal connected to the output terminal of the inverter, a second input terminal and an output terminal, and
  - a second NOR gate having a first input terminal that receives the first detection signal, a second input terminal connected to the output terminal of the first NOR gate, and an output terminal connected to the second input terminal of the first NOR gate.

12. The power on reset circuit according to claim 11, further comprising a buffer circuit connected to the output terminal of the latch circuit and having two series-connected inverters.

13. The power on reset circuit according to claim 11, wherein a voltage difference between the first and second threshold voltages is greater than an oscillation of the power supply voltage level during power-up.

14. A method of generating a power-on reset signal comprising:
- generating a first detection signal when a first threshold is greater than a power supply voltage level during power-up, the first detection signal having the power supply voltage level;
- generating a second detection signal when a second threshold is greater than the power supply voltage level, the second detection signal having the power supply voltage level and the second threshold voltage being higher than the first threshold voltage; and
- generating the power-on reset signal responsive to the first and second detection signals,
- a voltage difference between the first and second threshold voltages is greater than an oscillation of the power supply voltage level during power-up.

15. The method of generating a power-on reset signal of claim 14, wherein said generating of the power-on reset signal comprises setting the power-on reset signal to a logically activated state when the power supply voltage level is less than the first threshold voltage during power-up and resetting the power-on reset signal to a logically deactivated state when the power supply voltage level is greater than the second threshold voltage level during power-up.

16. A power on reset circuit comprising:

a first voltage level detector generating a first detection signal when a first threshold is greater than a power supply voltage level during power-up, the first detection signal having the power supply voltage level;

a second voltage level detector generating a second detection signal when a second threshold is greater than the power supply voltage level, the second detection signal having the power supply voltage level and the second threshold voltage being higher than the first threshold voltage; and a latch circuit generating the power-on reset signal responsive to the first and second detection signals, a voltage difference between the first and second threshold voltages is greater than an oscillation of the power supply voltage level during power-up.

17. The power on reset circuit of claim 16, wherein said latch circuit sets the power-on reset signal to a logically activated state when the power supply voltage level is less than the first threshold voltage during power-up and resets the power-on reset signal to a logically deactivated state when the power supply voltage level is greater than the second threshold voltage level during power-up.

* * * * *